US009208271B1

(12) United States Patent
Meir et al.

(10) Patent No.: US 9,208,271 B1
(45) Date of Patent: Dec. 8, 2015

(54) TRANSACTION CORRELATION SYSTEM (75) Inventors: Reshef Meir, Jerusalem (IL); Yael Kinderman, Neve-Monosson (IL); Yoav Hollander, Kiryat-Ono (IL); Ohad Givaty, Yahud (IL)

(73) Assignee: Cadence Design Systems, Inc., San Jose, CA (US)

( * ) Notice: Subject to any disclaimer, the term of this patent is extended or adjusted under 35 U.S.C. 154(b) by 508 days.

(21) Appl. No.: 12/950,613

(22) Filed: Nov. 19, 2010

(51) Int. Cl.
*G06F 17/50* (2006.01)
*G06F 11/36* (2006.01)

(52) U.S. Cl.
CPC .......... *G06F 17/5045* (2013.01); *G06F 11/362* (2013.01)

(58) Field of Classification Search
CPC  G06F 17/5009; G06F 17/5045; G06F 11/362
USPC ........................................................ 703/14
See application file for complete search history.

(56) References Cited

U.S. PATENT DOCUMENTS

| | | | | |
|---|---|---|---|---|
| 7,289,964 | B1* | 10/2007 | Bowman-Amuah | 705/1.1 |
| 8,036,870 | B2* | 10/2011 | Dierickx et al. | 703/13 |
| 2002/0120891 | A1* | 8/2002 | Bartenstein et al. | 714/724 |
| 2003/0058277 | A1* | 3/2003 | Bowman-Amuah | 345/765 |
| 2006/0161411 | A1* | 7/2006 | Starr | 703/14 |
| 2010/0009270 | A1* | 1/2010 | Thiele | 430/5 |
| 2010/0262414 | A1* | 10/2010 | Joshi et al. | 703/14 |

OTHER PUBLICATIONS

Wolfgang Mayer, NPL, "Prioritising Model-Based Debugging Diagnostic Reports", Oct. 4, 2008, google.*
Denmat, Tristan, et al., "Data Mining and Cross-checking of Execution Traces: A Re-interpretation of Jones, Harrold and Stasko Test Information Visualization," In Proceedings of the 20th IEEE/ACM International Conference on Automated Software Engineering Long Beach, CA, USA, Nov. 7-11, 2005, pp. 396-399, ASE '05. ACM, New York, NY.
Ernst, Michael D., et al.,"Dynamically Discovering Likely Program Invariants to Support Program Evolution," IEEE Transactions on Software Engineering, Feb. 2001, pp. 99-123, vol. 27, No. 2.
Hao, Dan, et al., "A Similarity-Aware Approach to Testing Based Fault Localization," In Proceedings of the 20th IEEE/ACM International Conference on Automated Software Engineering Long Beach, CA, Nov. 7-11, 2005, pp. 291-294, ASE '05, ACM, New York, NY.

(Continued)

*Primary Examiner* — Omar Fernandez Rivas
*Assistant Examiner* — Angel Calle
(74) *Attorney, Agent, or Firm* — Holland & Knight LLP; Mark H. Whittenberger, Esq.

(57) ABSTRACT

Embodiments provide methods, systems, and devices involving transaction correlation tools that may record a limited number of run attributes yet are likely to be important in the debugging process. Some embodiments may include novel tabular representations of the runs. Embodiments may allow the user to specify directives for the recording of the runs and the creation of these tables. Embodiments may include comparing sets of failing and passing runs, which may be generated at random. This approach is called statistical debugging, as it employs statistical tools to find attributes of the DVE that tend to co-occur with the failure.

32 Claims, 8 Drawing Sheets

(56) References Cited

OTHER PUBLICATIONS

Jiang, Lingxiao, et al., "Context-Aware Statistical Debugging: From Bug Predictors to Faulty Control Flow Paths," In Proceedings of the Twenty-Second IEEE/ACM International Conference on Automated Software Engineering Atlanta, Georgia, Nov. 5-9, 2007. pp. 184-193, ASE '07. ACM, New York, NY.

Jones, James, et al., "Empirical Evaluation of the Tarantula Automatic Fault-Localization Technique," In Proceedings of the 20th IEEE/ACM International Conference on Automated Software Engineering, Long Beach, CA, USA, Nov. 7-11, 2005, 2005, pp. 273-282, ASE '05. ACM, New York, NY.

Jones, James, et al., "Visualization of Test Information to Assist Fault Localization," In Proceedings of the 24th International Conference on Software Engineering, Orlando, Florida, May 19-25, 2002, pp. 467-477, ICSE '02. ACM, New York, NY.

Liblit, Ben, et al., "Bug Isolation via Remote Program Sampling," In Proceedings of the PLDI '03 San Diego, CA, Jun. 9-11, 2003, pp.141-154.

Liblit, Ben, et al., "Scalable Statistical Bug Isolation," In Proceedings of the PLDI '05, Chicago, IL, Jun. 12-15, 2005, pp. 15-26, ACM.

Meir, R., et al., "Learning the Bug from Many Runs: A New Coverage-Driven Approach for Automatic Debugging," Cadence Technical Conference in Anaheim, CA, May 2005, 6 pages.

Renieris, Manos, et al., "Fault Localization With Nearest Neighbor Queries," In Proceedings of the $18_{th}$ IEEE International Conference on Automated Software Engineering, Montreal, Quebec, Oct. 2003, pp. 30-39.

* cited by examiner

TRANSACTION CORRELATION SYSTEM

BACKGROUND

Embodiments relate to devices, systems, and methods for finding the cause of bugs that are located in a Design under Test (DUT) or in its Verification Environment (VE). The system may be referred to as the Design Verification Environment (DVE). Embodiments may automate portions of the debugging process of simulated hardware designs.

There are different known methods of statistical debugging. However, these methods may suffer from different limitations. For example, methods may be limited to the analysis of code coverage or record vast amounts of run attributes.

Some methods of statistical debugging may be limited to one-dimensional results, i.e., they try to find a single cause for the bug. There are exceptions; they may, however, require powerful learning algorithms. The implication may be the following: either the search space may be very restricted (meaning that many interesting bugs will be overlooked) or heavy statistical tools may be needed, which may typically require over 2000 runs in order to give significant results. This may not be a strong limitation in some software environments, but may be an unrealistic demand in some hardware worlds. For comparison, a typical hardware session may contain only a few hundred runs, and only a small number of these may exhibit a specific failure (sometimes just 1 run).

Some technology also handles noise very badly. Typically, tools return a large set of suspicious code lines or other attributes and the user may still be required to go over many results that have nothing to do with the bug, spending valuable time. This problem may occur mainly due to the law of large numbers: if the search space is big enough, then there may be features that correlate with the bug by mere chance. Some methods may provide a partial remedy to this by using confidence analysis. However, this may only work well for simple binary attributes, whereas the bug may sometimes be caused by a complex cause.

BRIEF SUMMARY

Embodiments provide methods, systems, and devices involving transaction correlation tools (TC) that may record a limited number of run attributes yet are likely to be important in the debugging process.

Some embodiments may include novel tabular representations of the runs. Embodiments may allow the user to specify directives for the recording of the runs and the creation of these tables. Embodiments may include comparing sets of failing and passing runs, which may be generated at random. This approach is called statistical debugging, as it employs statistical tools to find attributes of the DVE that tend to co-occur with the failure.

Embodiments including these tabular representations may be aimed to enrich the class of bug-relevant attributes and imply potential relations and dependencies between the attributes, while incurring low overhead on the user in stating the directives.

Some embodiments may exploit this tabular representation to identify attributes (or sets of attributes) that are indicative with respect to the bug. Embodiments may include advanced statistical inference algorithms that reduce to a minimum the amount of false-positive results (attributes that are correlated by chance).

Some embodiments may include the combined application of tabular representation and inference algorithm to address the major shortcomings of existing inference methods described in the background section, thus advancing the state-of-the-art technology in this field.

More specifically, embodiments may include the following advantages. Abstract messages and tabular form may allow the program to record a limited number of run attributes that are likely to be important in the debugging process. This technology may allow one to achieve good results with just a handful of runs. Tabular representation may allow one to specify and locate complex causes, such as multiple events that occur in different areas of the DUT or multiple events that occur in different timings. Methods of transaction correlation may then work on tuples, or sets of attributes, which may be used as a uniform representation that allows the algorithm to ignore the complexity of the actual cause.

Along with supplying the input for the transaction correlation, structured tabular representation may enable one to better understand relations between events, and how they lead to the error.

Transaction correlation may generalize the confidence approach to multi-valued tuples that are sampled multiple times.

BRIEF DESCRIPTION OF THE DRAWINGS

The present disclosure is described in conjunction with the appended figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only and is not intended to limit the scope, applicability or configuration of the disclosure. Rather, the ensuing description of the preferred exemplary embodiment(s) will provide those skilled in the art with an enabling description for implementing a preferred exemplary embodiment. It should be understood that various changes may be made in the function and arrangement of elements without departing from the spirit and scope as set forth in the appended claims.

Embodiments may include tabular descriptions that are generated from a log of each run, with minimal user input. Statistical approaches that may exploit the structure of this tabular representation to mine bug-related data provide further innovations. Embodiments may include a new statistical approach to deal with the noise that is typical to verification environments and the automated search approaches, which can find bugs caused by multiple values of a single (or complex) attribute.

Some embodiments may be applicable in testing environments that employ CDV methodology (Coverage Driven Verification), especially within the approach of directed-random testing. Such environments are common in hardware design, but can also be found in the software world. In such environments, much of the infrastructure for a tabular representation already exists in the form of the coverage items and events. Further, random tests provide for a large sample of failing and passing runs, on which statistical inferences may be made using the transaction correlation approaches.

Merely by way of example, consider a testing environment of a simple device that contains a buffer. The system may contain many attributes, and two of them could be the state of buffer and the type of the packet. These two attributes (as all others) can constitute the columns of a tabular representation, whereas the rows can be automatically filled according to the actual values from the logs of the random runs. Suppose that an arrival of a "big" packet to a "full" buffer causes a loss of data, which causes the test to crash sometime later. Transaction correlation approaches, when applied to the relevant table, may correctly identify the state as correlated with the failure.

Different embodiments of transaction correlation approaches could be used for data mining of causal information in any system that has the following properties, merely by way of example: there may be a binary (yes/no) property ("target") whose value is known (failing/passing in the world of verification); there may be multiple attributes that may be causally related to the target (coverage values and other functional attributes in our world); there may be random samples of all attributes, where each attribute may receive multiple values in each sample (or no values at all). Transaction correlation approaches may provide particular advantage in environments where the number of samples is limited. Examples of such environment are common in expert systems, e.g., for medical diagnosis and for geological data analysis.

Embodiments including tabular representations may involve runs that are more than just a sequence of unrelated attributes and commands. For example, in actual hardware environments, there are entities in the form of "packets" or "transactions" (which may be defined explicitly or implicitly in the program flow). Each such packet may have several interactions with the environments in different times during the run (not necessarily consecutive). An error may occur due to some irregularity in the flow of a single packet, or few related packets. As an example, one can think of an environment where the normal flow of a packet is: CREATE (with some parameters), get in BUFFER_A, get out of BUFFER_A, and KILL. An erroneous packet might, for example, skip a step, go in the wrong buffer, or get wrong parameters. Since interactions of different packets are often interleaved, it is a notoriously difficult task to identify such irregular temporal patterns. Embodiments may include abstract messages or instructions that allow for tracking such packets and transactions using simple user input. Embodiments may include constructing tables that correspond to the life of a specific transaction, or a specific type of transactions, hence transaction correlation. Embodiments thus may include packet abstraction to transform temporal patterns into flat patterns (tables), and then use statistical inference on these tables.

Embodiments may involve one or more runs. A run may be described as a single simulation run of the DVE. Runs that fail due to some error may be described as failing runs or bad runs. Runs that complete without issuing any error may be referred to as passing runs or good runs.

Some embodiments may involve abstract messages. These abstract messages may be referred herein as MXs. An abstract message may include some form of instructions, which may be provided by a user. For example, an abstract message may be a line in the code that adds a special structured message (possibly with parameters) to the log of the run. In some embodiments, MXs are connected to coverage events.

Some embodiments may include tables. A table may be a tabular representation of a run. A table may include rows and columns, or other equivalent representations. Each column of a table may represent a single attribute of the environment (e.g., a variable). Columns are sometimes referred to as items. Each item may be sampled multiple times during a run. Each row may represent a single sampling point. Entries in the same row may contain the values of the table's attributes that were recorded at a specific sampling point.

In some embodiments, a simple table may be created from the messages written by a single MX, and its columns may be defined by the structure of the MX (e.g., current values of related coverage items). In simple tables, a row may correspond to a specific time during simulation.

In some embodiments, a join table may be created by different operations that are carried on a single table or several tables.

In some embodiments, a table may typically include up to 20-50 columns, but the number of rows can be much higher (up to 10-20K), merely by way of example.

Some embodiments may utilize tuples. A tuple may represent a subset of the columns or attributes in a specific table. The subset may be small, containing no more than 5 columns/items in some embodiments. A tuple value may represent a vector of values that were sampled from the attributes of the tuple at a specific time (i.e., it is a part of a row in the table).

Some embodiments may determine exceptional tuples. An exceptional tuple may be a tuple that gets different values (or different distribution of values) in failing runs and in passing runs. Some embodiments may utilize violating values. A violating value may be a tuple value that tends to occur more in failing runs than in passing runs. An exceptional tuple may have at least one violating value. Some embodiments may provide information regarding exceptional tuples and violating values to a user as part of an automated debugging process.

Figure 1:
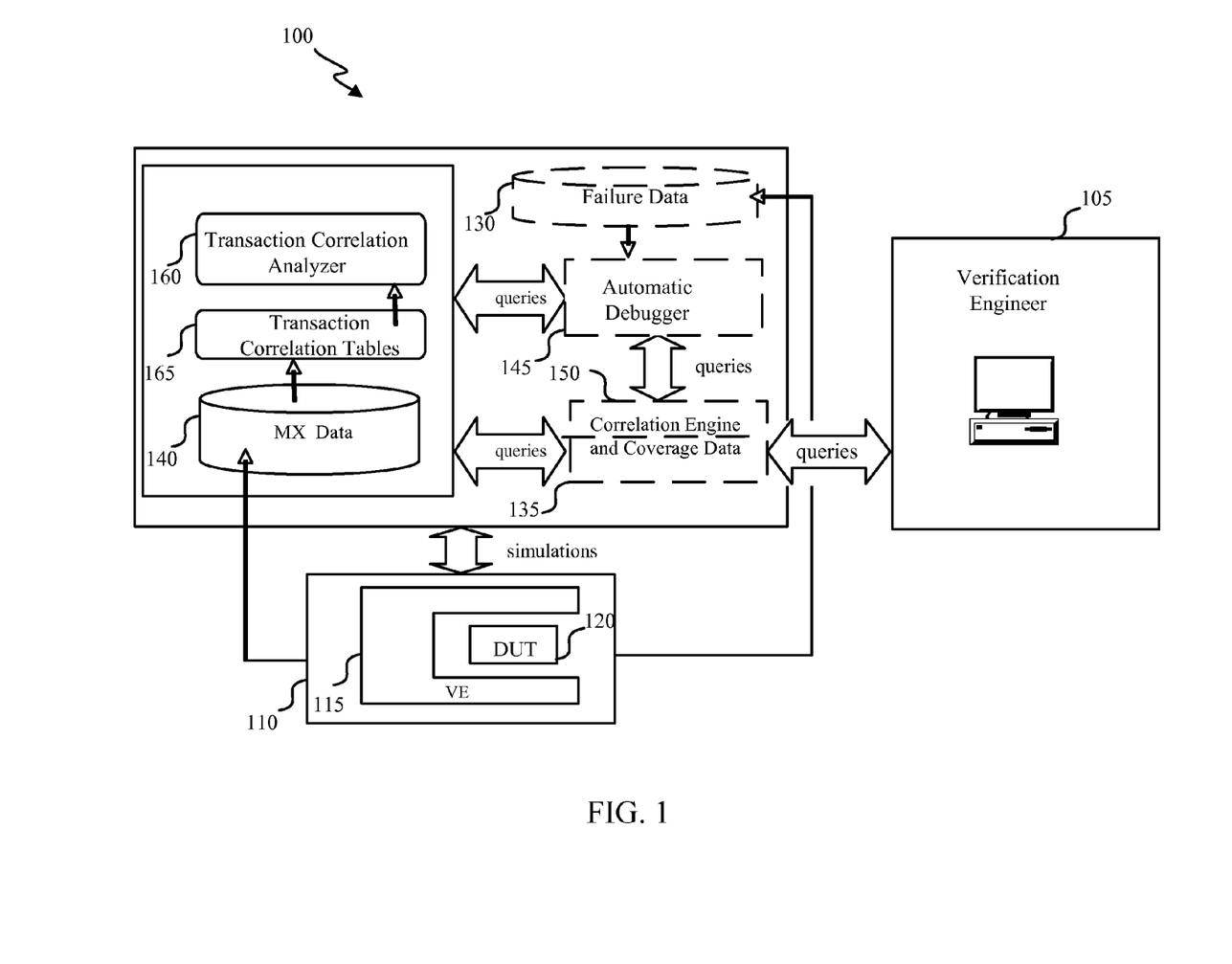
FIG. 1 provides a diagram of a transaction correlation system, in accordance with various embodiments.

FIG. 1 provides a diagram of transaction correlation system 100, in accordance with various embodiments. Verification engineer 105 may provide coverage and/or MX definitions to the DVE 110. This information gathered from the DVE according to these definitions may be stored on a database, such as MX database 140. Also, DVE 110 may include VE 115 and DUT 120. After simulations or runs, data on passing and failing runs may be stored in different databases, such as failure database 130, coverage database 135, and/or MX database 140. In some embodiments, an automatic debugger 145 may be set into motion to find hints for the observed failures. In some embodiments, hints of a more simple form may be found directly using a correlation engine 150 and coverage database 135, without using transaction correlation.

Some embodiments may include transaction correlation tables 165 as a method to capture temporal relations (stored in MX database 140, for example) in a non-sequential form. Transaction correlation analyzer 160 may be used on input structured via the tables 165, to find hints in some embodiments. Alternatively, the transaction correlation analyzer 160 can be operated directly to find hints in any other form of structured input. Hints may be related to bugs within the DVE. In some embodiments, the attributes associated with one or more bugs may be presented to user 105. In some embodiments, values of attributes associated with one or more bugs may be presented to user 105.

Embodiments may utilize abstract messages, or MXs. MX actions may be structured messages added by the user to trace information regarding high level activity in the design. For example, the messages can follow data packets through the different stations (in the DUT) they visit and the various transformations they undergo throughout its life. There are various MX types to describe the various high level activities. For example, mx_arrive messages may describe arrival of a transaction into a station; mx_transform message may describe transformation of a transaction into another; mx_status message may describe status of a station that was updated; and mx_match/mx_mismatch messages may describe the match/mismatch of 2 transactions. In some embodiments, the user can define new types of abstract messages to support the needs of his or her specific DUT domain.

In some embodiments, a simple table, generated from an MX, may have default columns, including, for example, the time of occurrence and its related unit. The rest of the columns may be defined according to the parameters of the MX.

For example, for the following MX action mx_arrived (<name>, <obj>, <related cover group>), where the items of the cover group are: x1, x2, . . . , xk, the related table header may have the following columns: time, related unit, . . . , transaction object, x1, x2, . . . , xk. A row may be generated with the related values for each occurrence of the MX action in the run.

Some embodiments may utilize join tables. Join tables may be used to combine the basic MX tables according to the user interest. Join tables may enable the capturing of the status of more than one station, at an interesting event, and/or to compare a data packet with the packet that preceded it, for example.

In some embodiments, join tables may be defined using "sql like" commands that may be written by the user. The following provides some examples of how join tables may be defined: (1) join by column (or a set of columns) using inner/left/right join; (2) join last—join by time column (taking the last row that matches); (3) join between—assume table1 includes a column time1 and table2 includes columns time2a and time2b, join between will join rows where time2a≤time1≤time2b; and (4) use computed columns (columns based on some other columns in the table). Some embodiments may utilize other join table definitions. In some embodiments, a user may provide the join table definitions.

Figure 2:
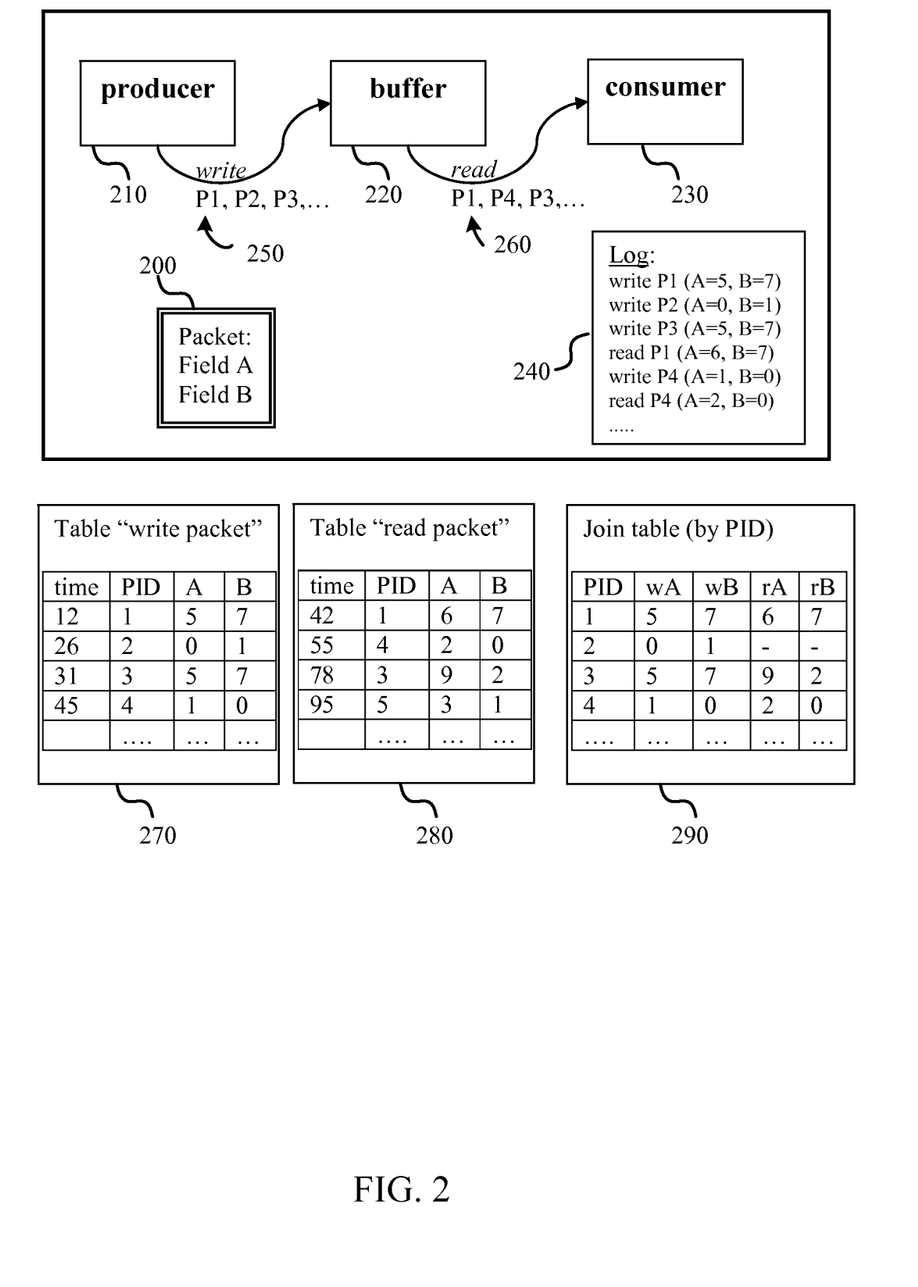
FIG. 2 provides an example of a transaction correlation tabular representation, in accordance with various embodiments.

FIG. 2 provides an example of correlation tabular representations in accordance with various embodiments. For this example, a packet 200 includes two attributes, designated Field A and Field B. As packet 200 moves through the DVE, from Producer 210 to Buffer 220 and then Consumer 230, different actions may be recorded. For example, write action 250 and read action 260 may be recorded. A log 240 of recorded data is also shown. A first table 270, designated as "write packet," and a second table 280, designated as "read packet" may be created, reflecting different sampled values for the packet, designated with different packet ids (PID). These tables may be treated as flattened tables. A join table 290 is also shown, combining the data from the table 270 and table 280. This table is also flattened. In this case, the join table is formed based on the PIDs.

Figure 3:
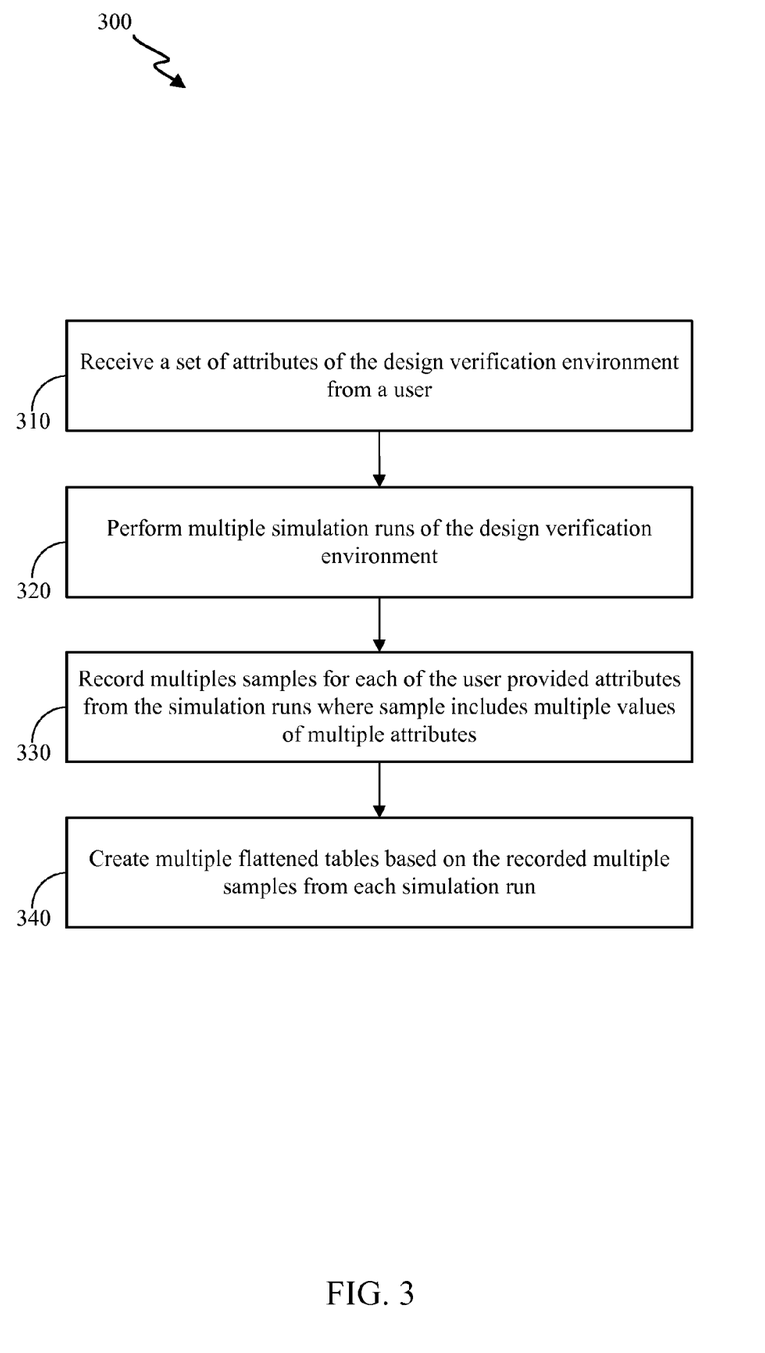
FIG. 3 provides a flow chart for a method of automated debugging in a design verification environment using tabular representation, in accordance with various embodiments.

FIG. 3 provides a flow chart for a method 300 of automated debugging in a design verification environment using the tabular representation discussed above. Method 300 may be implemented using systems such as system 100 of FIG. 1 above, or systems 700 or 800 of FIGS. 7 and 8 described below. At block 310, a set of attributes of the design verification environment are received from a user. At block 320, multiple simulation runs of the design verification environment are performed. At block 330, multiple samples for each of the user provided attributes from the simulation runs are recorded. Each sample includes multiple values of the multiple attributes. At block 340, multiple flattened tables are created based on the recorded multiple samples from each simulation run.

Some embodiments of method 300 may include a set of attributes that are related. For example, in some cases, the set of attributes may be associated with a packet or transaction. In some cases, the set of attributes may be part of a coverage definition. In some embodiments, two or more tables may be joined. In some embodiments, a user may provide information regarding how to join the tables.

Some embodiments provide means for recognizing "exceptional tuples". Exceptional tuples are tuples that may behave differently in passing runs and in failing runs. In some embodiments, their values may have different distributions between passing and failing runs.

Figure 6A:
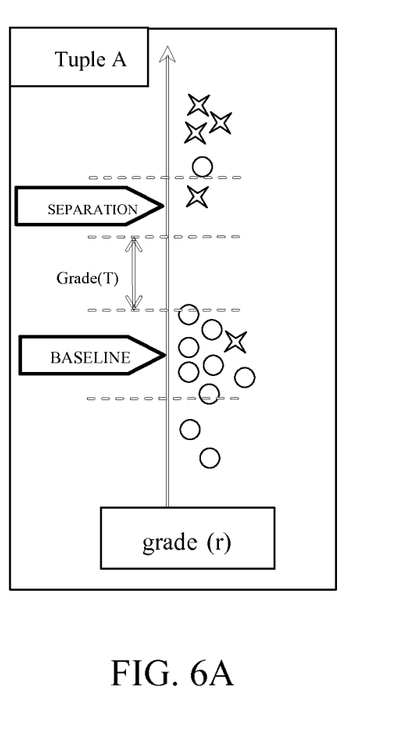
FIGS. 6A, 6B, and 6C provide examples of three prototypical tuples, in accordance with various embodiments.

For example, consider the tuple <x,y>, and suppose that in the passing runs <x,y> always get the values <x=0,y=0> and <x=1,y=1>. In contrast, most failing runs also contain the tuple values <x=1,y=0> or <x=0,y=1> (in addition to the "normal" values <0,0> and <1,1>). In this case, it is clear that the tuple behaves differently in failing runs and it is therefore exceptional. FIG. 6A provides an example that shows such an exceptional tuple.

Figure 4:
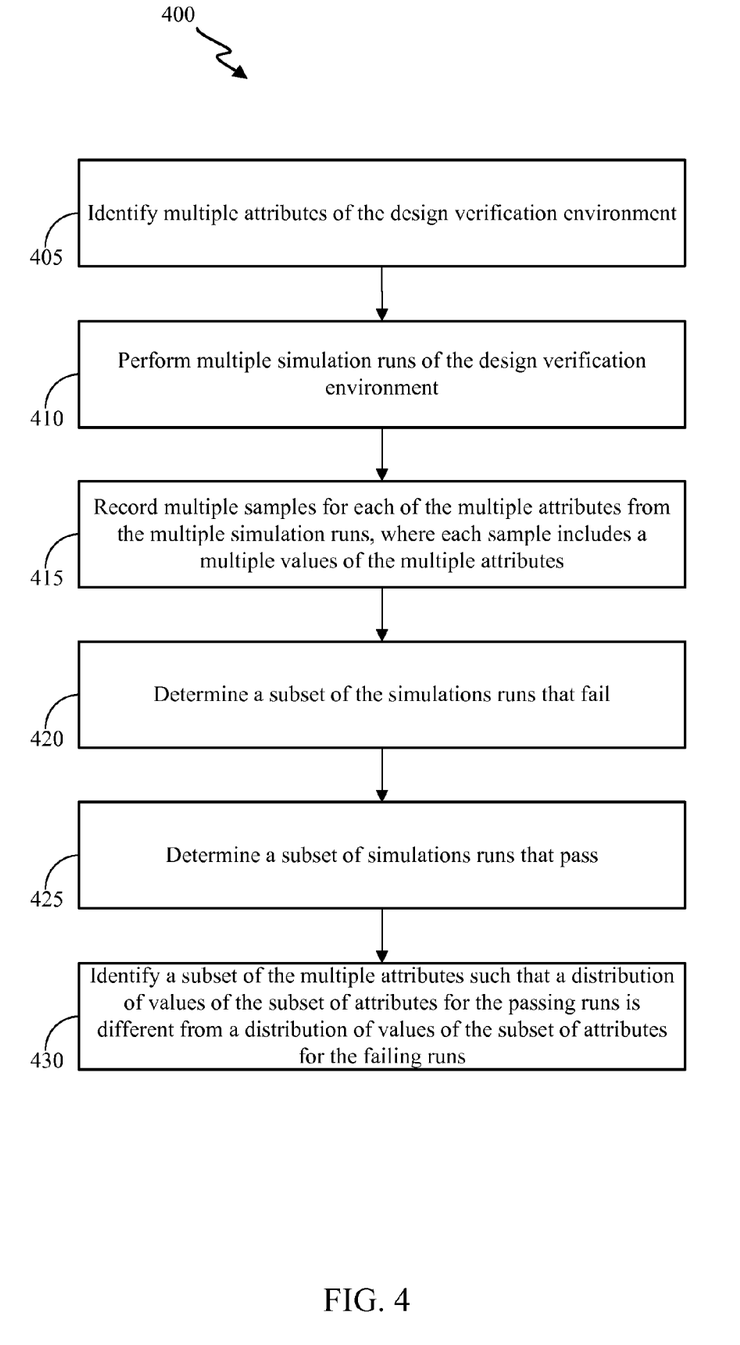
FIG. 4 provides a flow chart of a method of automated debugging of a design verification environment, in accordance with various embodiments.

FIG. 4 provides a method of automated debugging of a design verification environment, in accordance with various embodiments. Method 400 may be implemented using systems such as system 100 of FIG. 1 above, or systems 700 or 800 of FIGS. 7 and 8 described below. At block 405, multiple attributes of the design verification environment are identified. At block 410, multiple simulation runs of the design verification environment are performed. At block 415, multiple samples for each of the multiple attributes from the multiple simulation runs are recorded. Each sample includes multiple values of the multiple attributes. At block 420, a subset of the simulation runs that fail is determined. At block 425, a subset of simulation runs that pass is determined. At block 430, a subset of the multiple attributes such that a distribution of values of the subset of attributes for the passing runs is different from a distribution of values of the subset of attributes for the failing runs is identified.

Some embodiments may provide a method for finding exceptional tuples. Finding exceptional tuples may be found for different tables. The method for finding exception tuples may also be used as part of a method to find bug causes.

Figure 5:
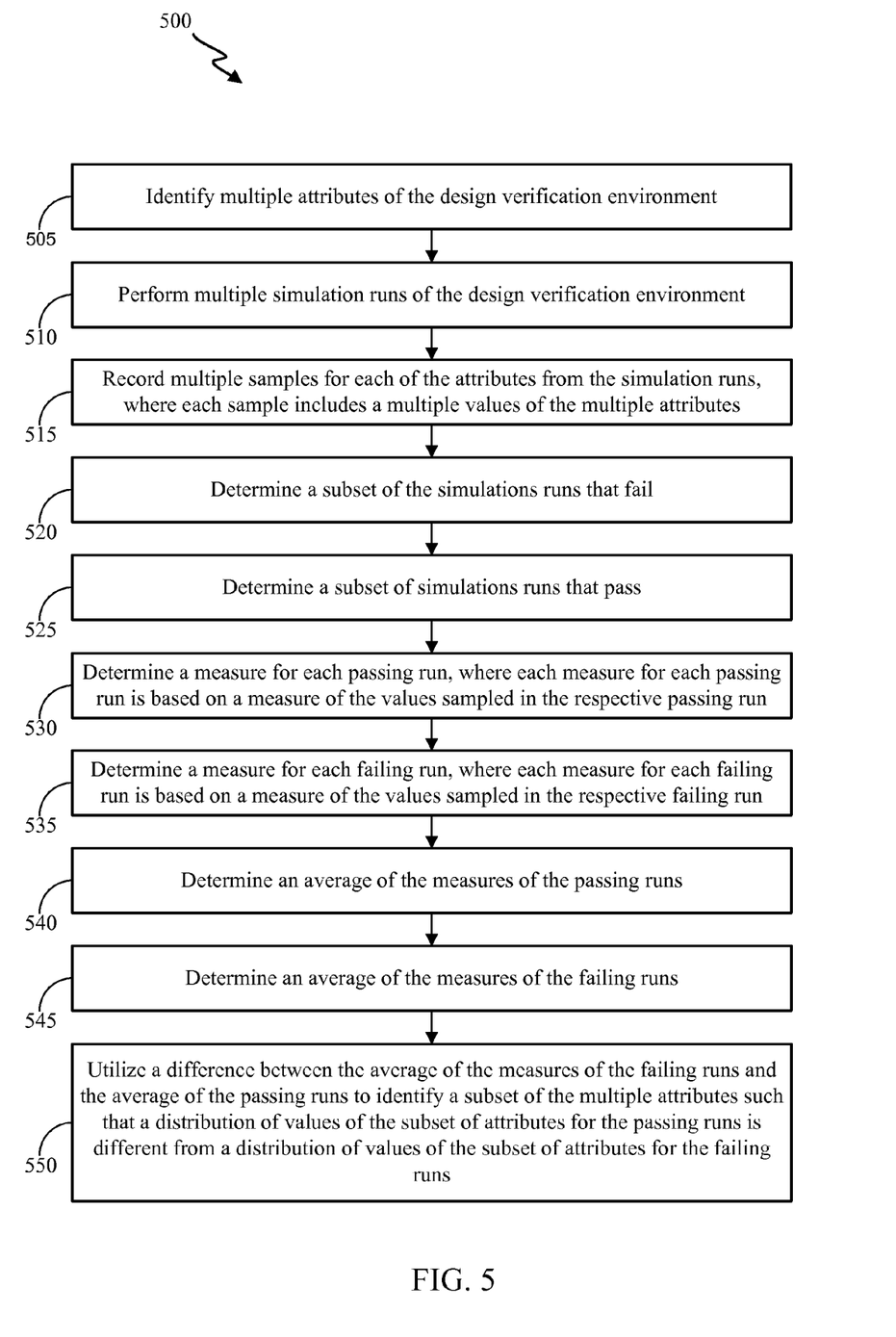
FIG. 5 provides a flow chart of a method of automated debugging of a design verification environment, in accordance with various embodiments.

Some embodiments may include a method of finding exceptional tuples such as the following as shown in FIG. 5. FIG. 5 may include aspects of method 400 of FIG. 4. For example, FIG. 5 provides a method 500 of automated debugging of a design verification environment. Method 500 may be implemented using systems such as system 100 of FIG. 1 above, or systems 700 or 800 of FIGS. 7 and 8 described below. At block 505, multiple attributes of the design verification environment are identified. At block 510, multiple simulation runs of the design verification environment are performed. At block 515, multiple samples for each of the multiple attributes from the multiple simulation runs are recorded. Each sample includes multiple values of the multiple attributes. At block 520, a subset of the simulation runs that fail is determined. At block 525, a subset of simulation runs that pass is determined.

In addition, method 500 includes determining a measure for each passing run at block 530. Each measure for each passing run is based on a measure of the values sampled in the respective passing run. At block 535, a measure for each failing run is determined. Each measure for each failing run is based on a measure of the values sampled in the respective failing run. At block 540, an average of the measures of the passing runs is determined. At block 545, an average of the measures of the failing runs is determined. At block 550, the difference between the average of the measures of the failing runs and the average of the passing runs is utilized to identify a subset of the multiple attributes such that a distribution of values of the subset of attributes for the passing runs is different from a distribution of values of the subset of attributes for the failing runs.

In some embodiments, one or more values from the identified subset of attributes may be identified. The measure of the one or more respective identified values sampled in the respective failing run may be greater than the average of the measures of the passing runs. The one or more identified values may be presented to a user.

In some embodiments, each passing run may be treated as if it were a failing run. In some embodiments, an expectation value of the measure of a respective value in the failing run may equal an expectation value of the measure of the respective value in the passing run when the value is generated at random.

In some embodiments, one or more flattened tables may be generated based on the recorded multiple samples for each simulation run. The flattened tables may be utilized to identify the subset of the multiple attributes such that the distribution of values of the subset of attributes for the passing runs is different from the distribution of values of the subset of attributes for the failing runs utilizing the flattened tables.

In some embodiments, the multiple identified attributes may be received from a user.

Methods for finding exceptional tuples, such as methods 400 and/or 500 may be done in a variety of ways. Some embodiments may utilize a method that returns a list of exceptional tuples. A series of runs may be conducted, with some runs passing and some runs failing. One or more tables may be recorded during each run, where each table records one or more attributes sampled multiple times during each respective run.

For a given table TAB, which may be a combination of tables such as a join table, that is recorded for the multiple runs, a method may then include examining the tuples T, or subsets of attributes. For each value V of tuple T, several different pieces of information may be determined. For example, the number of failing runs that include value V may be determined; this may be designed for convenience as factor A. The total number of failing runs from the set of simulation runs may also be determined; this may be designed as factor B. Similarly, the number of passing runs that include value V may be determined and may be designed as factor C. The total number of passing runs may also be determined, and designed as factor D. Factors such as these may be utilized to determine a measure of how exceptional a given tuple is.

For example, in some embodiments, passing and failing grades may be assigned to each value. In one embodiment, a passing grade may be defined as:

$$\text{passing\_grade}(V) = (A+C/D)/(B+1) - (C-C/D)/(D-1) \tag{I}$$

In one embodiment, a failing grade may be defined as:

$$\text{failing\_grade}(V) = (A+1)/(B+1) - (C-1)/(D-1) \tag{II}$$

In some embodiments, a measure of each run may be determined that reflects the passing grades for the values of the run. In one embodiment, for each passing run R, a grade (R) may be equal to the maximum passing grade from the passing grades determined for the values V that occur in R. In some embodiments, a grade for a run R may be normalized or scaled so that it may be combined or compared to other grades. For example, a grade(R) may be transformed such that it takes the original value of x (which is random variable in the range [−1,1]) and translates it to a normal random variable with expectation 0. This may enable the computation of confidence intervals that are based on normal distribution. This transformed grade(R) may be represented herein as grade'(R).

Some embodiments may include determining an average grade for the passing runs. This may be referred to as a baseline measure. In some embodiments, a baseline measure may equal the average of the transformed grade(R) of the passing runs.

In some embodiments, a measure of each run may be determined that reflects the failing grades for the values of the run. In one embodiment, for each failing run R, a grade(R) may be equal to the maximum failing grade from the failing grades determined for the values V that occur in R. In some embodiments, a grade for a run R may be normalized or scaled so that it may be combined or compared to other grades. For example, a grade(R) may be transformed such that it takes the original value of x (which is random variable in the range [−1,1]) and translates it to a normal random variable with expectation 0. This may enable the computation of confidence intervals that are based on normal distribution. This transformed grade(R) may be represented herein as grade'(R).

Some embodiments may include determining an average grade for the failing runs. This may be referred to as a separation measure. In some embodiments, a separation measure may equal the average of the transformed grade(R) of the failed runs.

Utilizing a measure of the failing runs and the passing runs for a tuple T, an overall grade for the tuple T may be determined. In one embodiment, a grade for the tuple T may equal the difference between the separation measure and the baseline measure for the tuple. In some cases, the grade for the tuple may also take into account a confidence interval. For example, in one embodiment, the tuple grade for T may equal the following:

$$\text{GRADE}(T) = (\text{SEPARATION} - \text{BASELINE}) - (\text{confidence interval}) \tag{III}$$

The confidence interval utilized in the above equation may depend on the total number of runs and tuples. When there are more candidate tuples, the grade may decrease. When there are more runs, the results may be more conclusive and thus the grade may increase.

Some embodiments may include having the grades for the tuples T compared to a threshold. In one embodiment, if the grade for tuple T is greater than the threshold, the tuple T may be considered or marked exceptional. In some embodiments, the threshold may be greater than zero. In some cases, some exceptional tuples may be filtered out if they are dominated by other tuples. For example, if <x,y,z> is only slightly better (or worse) than <x,y>, then it may be redundant.

Some embodiments may utilize the determined exceptional tuples to determine possible values that may be the source of a bug with the design verification environment. For example, for each table TAB, a set of exceptional tuples for TAB may be determined as discussed above. This set may be referred to as set A. The tuples T within set A may be considered. For example, the values v of each tuple T may be considered; this set of values v may be represented as V. Some embodiments may include comparing a grade (v) for v in V to the baseline for the tuple. When the grade (v) is significantly higher than the BASELINE(T), then value v of tuple T may be considered as a possible cause of a bug in the DVE. Such values v may be presented to a user. In some case, significance becomes lower if there are more candidate tuples. Also note that values may be multi-valued. For example, <x,y> is one of {<1,1>; <1,2>; <2,2>}.

Figure 6B:
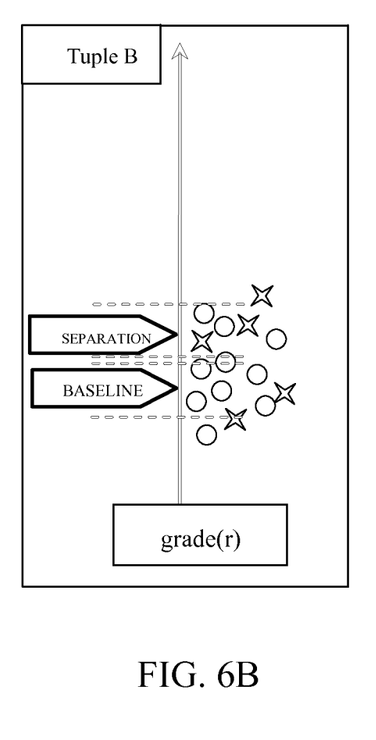
Figure 6C:
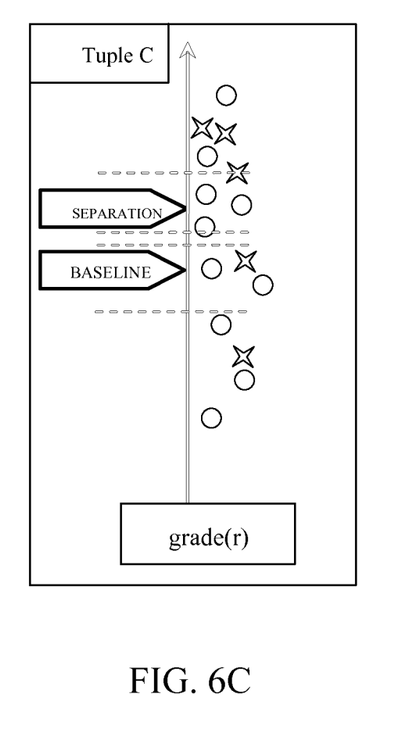

FIGS. 6A, 6B, and 6C provide three prototypical tuples for example. FIG. 6A shows a Tuple A that may be really exceptional. It has a few violating values that boost the grade of the failing runs (represented with ⋈ symbols), and thus the SEPARATION. Since most passing runs (represented with ○ symbols) do not have these values, they have low grade and thus the BASELINE is low, and the grade of the tuple is high. The dotted lines mark the boundaries of the confidence intervals. Tuple B of FIG. 6B has no violating values (i.e., all runs have more or less the same values). Therefore both BASELINE and SEPARATION are low, and the grade is 0. Tuple C of FIG. 6C may be what one may call an "ID-like" tuple. It has many violating values, which increase not only the grade of failing runs, but also of passing runs. Thus the SEPARATION is high, but so is the BASELINE, which means the grade will be 0. Of course in reality, most tuples may not fall directly in one of these three categories, but rather somewhere between them.

Embodiments may address the difficulty posed by ID-like tuples. Consider a tuple with single attribute, which is the ID (or the seed) of the run. Then the value in each run is different, and in particular one may have "different behavior" in failing and in passing runs. To understand the gravity of this problem, one may observe that a tuple containing 3-4 unrelated items, even with a small number of values, may have an "ID-like" behavior (see Tuple C in the FIG. 6C, for example). Therefore, systems, methods, devices in accordance with various embodiments may need to be able to distinguish such behavior from the "really exceptional tuples" (as in the previous example), and ignore them.

For example, in the ID-tuples, every run (or almost every run) may exhibit an irregular behavior, while one may be interested in tuples that exhibit irregular behavior only in the failed runs. As the example above shows, one may formalize this idea by measuring the irregularity in the failed runs (called SEPARATION) vs. the irregularity in the passed runs (called BASELINE). In an ID-like tuple, the BASELINE value may be high and therefore it will be ignored.

In some cases, computing the irregularity of each run may naively result in a strong bias (since an irregular value that appears only in a passed run will get a low grade). Some embodiments may correct this bias by treating every run as if it belongs to the set of failing runs when computing its grade as discussed above when determining exceptional tuples.

Some embodiments may thus utilize the following proposition: if the value v is generated at random (not correlated to the bug), then E[passing_grade(v)]=E[failing_grade(v)], where E[X] represents an expectation value of X. This proposition can guarantee that one does not introduce any bias when computing the grades.

Embodiments may significantly reduce runtimes by utilizing a limited number of parameters as seen, for example, in the grade calculations provided above. In those examples, 4 parameters are used, and 2 of them are fixed (the number of failed runs and the number of passed runs). Thus, there may be a limited number of actual computations that are performed a large number of times. Some embodiments may pre-compute all possible values once, and then use caching tables in the rest of the algorithms. This can significantly reduce the runtime.

Figure 7:
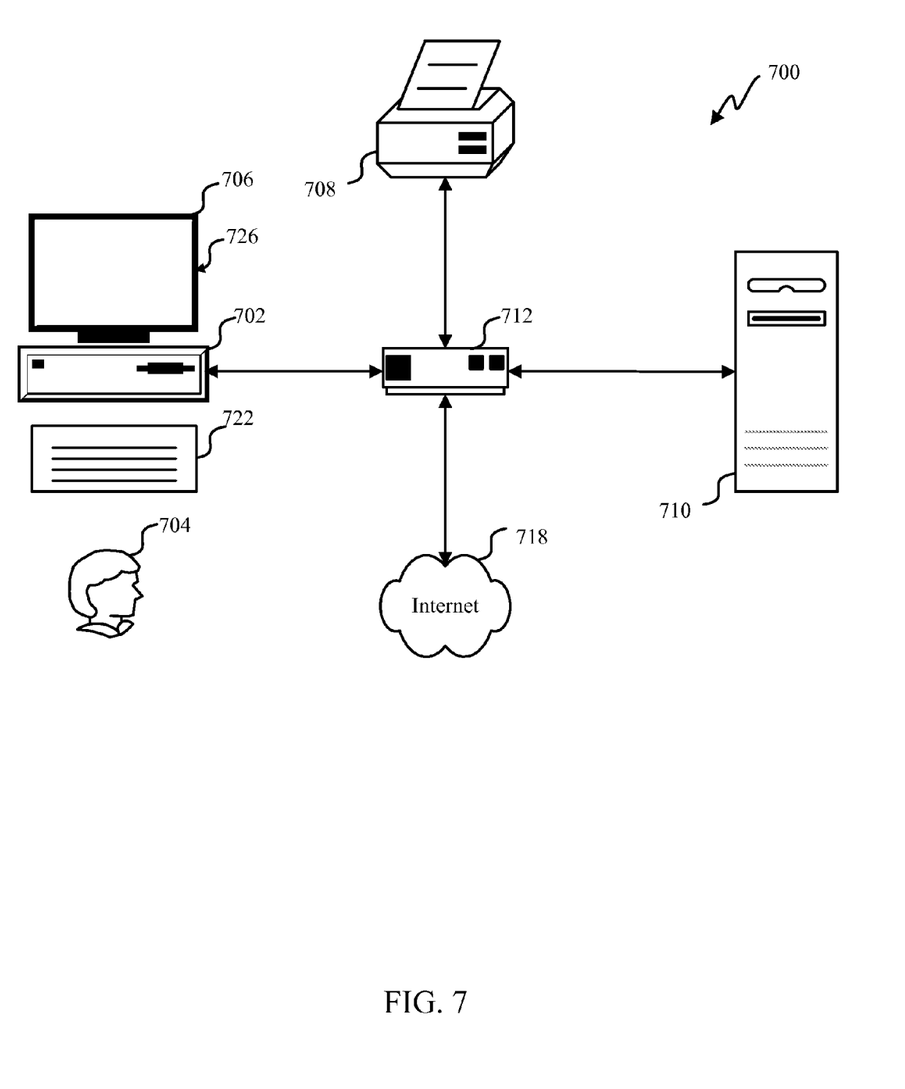
FIG. 7 provides a computer aided design (CAD) system, in accordance with various embodiments.

Referring next to FIG. 7, an exemplary environment with which embodiments may be implemented is shown with a computer aided design (CAD) system 700 that can be used by a designer 704 to design, for example, electronic circuits, which may be part of electronic design automation (EDA). The CAD system 700 can include a computer 702, keyboard 722, a network router 712, a printer 708, and a monitor 706. The monitor 706, processor 702 and keyboard 722 are part of a computer system 726, which can be a laptop computer, desktop computer, handheld computer, mainframe computer, etc. The monitor 706 can be a cathode ray tube (CRT), flat screen, etc.

A circuit designer 704 can input commands into the processor 702 using various input devices, such as a mouse, keyboard 722, track ball, touch screen, etc. If the CAD system 700 comprises a mainframe, a designer 704 can access the computer 702 using, for example, a terminal or terminal interface. Additionally, the computer system 726 may be connected to a printer 708 and a server 710 using a network router 712, which may connect to the Internet 718 or a WAN.

The server 710 may, for example, be used to store additional software programs and data. In one embodiment, software implementing the systems and methods described herein can be stored on a storage medium in the server 710. Thus, the software can be run from the storage medium in the server 710. In another embodiment, software implementing the systems and methods described herein can be stored on a storage medium in the computer 702. Thus, the software can be run from the storage medium in the computer system 726. Therefore, in this embodiment, the software can be used whether or not computer 702 is connected to network router 712. Printer 708 may be connected directly to computer 702, in which case, the computer system 726 can print whether or not it is connected to network router 712.

Figure 8:
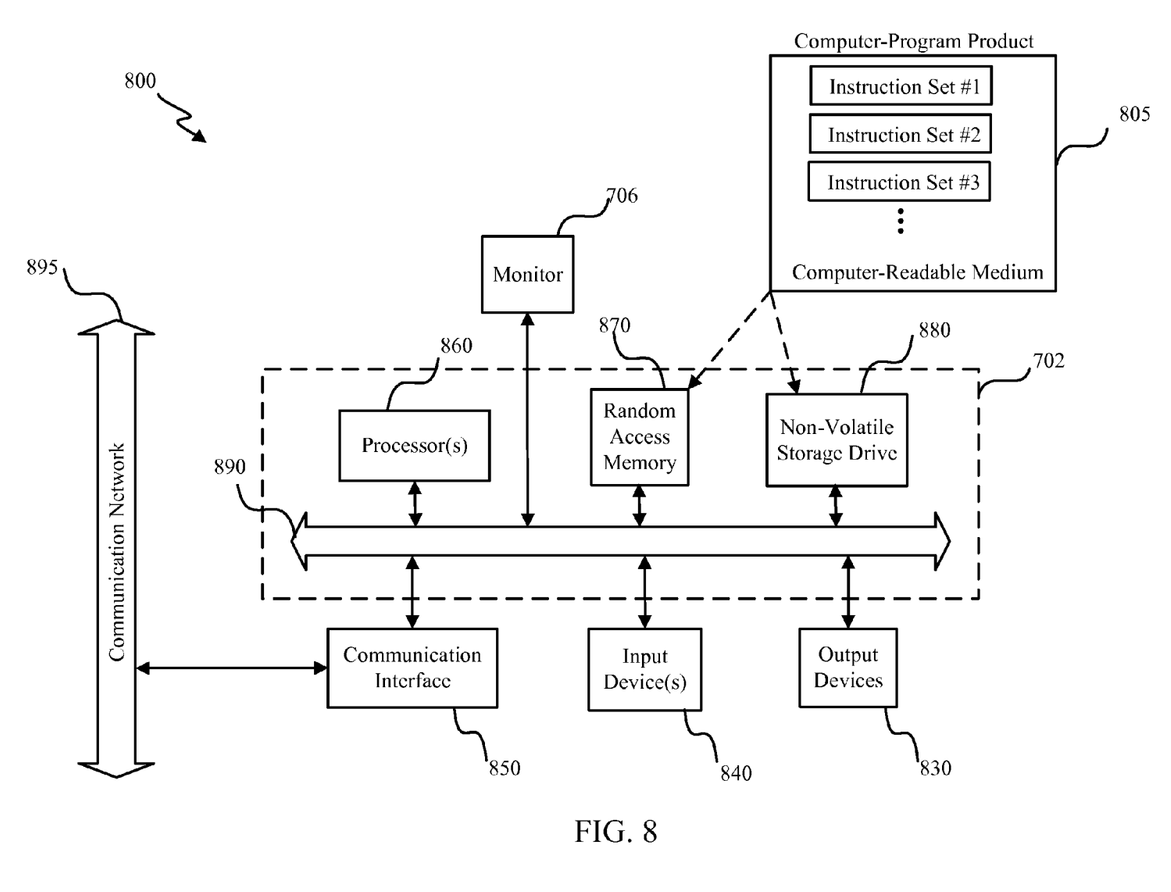
FIG. 8 provides a special-purpose computer system, in accordance with various embodiments.

With reference to FIG. 8, an embodiment of a special-purpose computer system 800 is shown. The above methods may be implemented by computer-program products that direct a computer system to perform the actions of the above-described methods and components. Each such computer-program product may comprise sets of instructions (codes) embodied on a computer-readable medium that directs the processor of a computer system to perform corresponding actions. The instructions may be configured to run in sequential order, or in parallel (such as under different processing threads), or in a combination thereof. After loading the computer-program products on a general purpose computer system 726, it is transformed into the special-purpose computer system 800 for CAD.

Special-purpose computer system 800 comprises a computer 702, a monitor 706 coupled to computer 702, one or more additional user output devices 830 (optional) coupled to computer 702, one or more user input devices 840 (e.g., keyboard, mouse, track ball, touch screen) coupled to computer 702, an optional communications interface 850 coupled to computer 702, and a computer-program product 805 stored in a tangible computer-readable memory in computer 702. Computer-program product 805 directs system 800 to perform the above-described methods. Computer 702 may include one or more processors 860 that communicate with a number of peripheral devices via a bus subsystem 890. These peripheral devices may include user output device(s) 830, user input device(s) 840, communications interface 850, and a storage subsystem, such as random access memory (RAM) 870 and non-volatile storage drive 880 (e.g., disk drive, optical drive, solid state drive), which are forms of tangible computer-readable memory.

Computer-program product 805 may be stored in non-volatile storage drive 880 or another computer-readable medium accessible to computer 702 and loaded into memory 870. Each processor 860 may comprise a microprocessor, such as a microprocessor from Intel or Advanced Micro Devices, Inc.®, or the like. To support computer-program product 805, the computer 702 runs an operating system that handles the communications of product 805 with the above-noted components, as well as the communications between the above-noted components in support of the computer-program product 805. Exemplary operating systems include Windows® or the like from Microsoft Corporation, Solaris® from Sun Microsystems, LINUX, UNIX, and the like.

User input devices 840 include all possible types of devices and mechanisms for inputting information to computer system 702. These may include a keyboard, a keypad, a mouse, a scanner, a digital drawing pad, a touch screen incorporated into the display, audio input devices such as voice recognition systems, microphones, and other types of input devices. In various embodiments, user input devices 840 are typically embodied as a computer mouse, a trackball, a track pad, a joystick, wireless remote, a drawing tablet, or a voice command system. User input devices 840 typically allow a user to select objects, icons, text and the like that appear on the monitor 706 via a command such as a click of a button or the like. User output devices 830 include all possible types of devices and mechanisms for outputting information from computer 702. These may include a display (e.g., monitor 706), printers, non-visual displays such as audio output devices, etc.

Communications interface 850 provides an interface to other communication networks and devices and may serve as an interface for receiving data from and transmitting data to other systems, WANs and/or the Internet 718. Embodiments of communications interface 850 typically include an Ethernet card, a modem (telephone, satellite, cable, ISDN), a (asynchronous) digital subscriber line (DSL) unit, a FireWire® interface, a USB® interface, a wireless network adapter, and the like. For example, communications interface 850 may be coupled to a computer network, to a FireWire® bus, or the like. In other embodiments, communications interface 850 may be physically integrated on the motherboard of computer 702, and/or may be a software program, or the like.

RAM 870 and non-volatile storage drive 880 are examples of tangible computer-readable media configured to store data such as computer-program product embodiments of the present invention, including executable computer code, human-readable code, or the like. Other types of tangible computer-readable media include floppy disks, removable hard disks, optical storage media such as CD-ROMs, DVDs, bar codes, semiconductor memories such as flash memories, read-only-memories (ROMs), battery-backed volatile memories, networked storage devices, and the like. RAM 870 and non-volatile storage drive 880 may be configured to store the basic programming and data constructs that provide the functionality of various embodiments, as described above.

Software instruction sets that provide the functionality of the present invention may be stored in RAM 870 and non-volatile storage drive 880. These instruction sets or code may be executed by the processor(s) 860. RAM 870 and non-volatile storage drive 880 may also provide a repository for storing data and data structures used in accordance with the present invention. RAM 870 and non-volatile storage drive 880 may include a number of memories including a main random access memory (RAM) for storage of instructions and data during program execution and a read-only memory (ROM) in which fixed instructions are stored. RAM 870 and non-volatile storage drive 880 may include a file storage subsystem providing persistent (non-volatile) storage for program and/or data files. RAM 870 and non-volatile storage drive 880 may also include removable storage systems, such as removable flash memory.

Bus subsystem 890 provides a mechanism for letting the various components and subsystems of computer 702 to communicate with each other as intended. Although bus subsystem 890 is shown schematically as a single bus, alternative embodiments of the bus subsystem may utilize multiple busses or communication paths within the computer 702.

The previous description provides exemplary embodiments only and is not intended to limit the scope, applicability, or configuration of the disclosure. Rather, the previous description of the exemplary embodiments will provide those skilled in the art with an enabling description for implementing one or more exemplary embodiments. It is understood that various changes may be made in the function and arrangement of elements without departing from the spirit and scope of the invention. Several embodiments were described herein, and while various features are ascribed to different embodiments, it should be appreciated that the features described with respect to one embodiment may be incorporated within other embodiments as well. By the same token, however, no single feature or features of any described embodiment should be considered essential to every embodiment of the invention, as other embodiments of the invention may omit such features.

Specific details are given in the previous description to provide a thorough understanding of the embodiments. However, it will be understood by one of ordinary skill in the art that the embodiments may be practiced without these specific details. For example, circuits, systems, networks, processes, and other elements in the invention may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process may be terminated when its operations are completed, but could have also included additional steps or operations not discussed or included in a figure. Furthermore, not all operations in any particularly described process may occur in all embodiments. A process may correspond to a method, a function, a procedure, a subroutine, a subprogram, etc. When a process corresponds to a function, its termination corresponds to a return of the function to the calling function or the main function.

Furthermore, embodiments of the invention may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

While detailed descriptions of one or more embodiments have been given above, various alternatives, modifications, and equivalents will be apparent to those skilled in the art without varying from the spirit of the invention. Moreover, except where clearly inappropriate or otherwise expressly noted, it should be assumed that the features, devices, and/or components of different embodiments may be substituted and/or combined. Thus, the above description should not be taken as limiting the scope of the invention.

What is claimed is:

1. A method of automated debugging of a design verification environment, the method comprising:
    identifying a plurality of attributes of the design verification environment;
    performing a plurality of simulation runs of the design verification environment;
    recording a plurality of samples for each of the plurality of attributes from the plurality of simulation runs, wherein each sample includes a plurality of values of the plurality of attributes;
    determining a subset of the simulation runs that fail;
    determining a subset of simulation runs that pass;
    identifying a subset of the plurality of attributes such that a distribution of values of the subset of attributes for the passing runs is different from a distribution of values of the subset of attributes for the failing runs;
    generating a log of the plurality of simulation runs;
    generating a tabular description based upon the log, wherein identifying the subset is based upon, at least in part, the tabular description;
    utilizing a plurality of flattened tables as an input to a transaction correlation algorithm to determine one or more bugs in the design verification environment;
    determining a measure for each passing run, wherein each measure for each passing run is based on a measure of the values sampled in the respective passing run;
    determining a measure for each failing run, wherein each measure for each failing run is based on a measure of the values sampled in the respective failing run; wherein the measure of the respective value sampled in the passing run is proportional to $(A+C/D)/(B+1)-(C-C/D)/(D-1)$ and the measure of the respective value sampled in the failing runs is proportional to $(A+1)/(B+1)-(C-1)/(D-1)$, wherein:
    A=the number of failing runs with the respective value;
    B=the number of failing runs;
    C=the number of passing runs with the respective value; and
    D=the number of passing runs.

2. The method of claim 1, wherein identifying the subset of the plurality of attributes further comprises:
    determining an average of the measures of the passing runs;
    determining an average of the measures of the failing runs; and
    utilizing a difference between the average of the measures of the failing runs and the average of the passing runs to identify the subset of the plurality of attributes.

3. The method of claim 2, further comprising:
    identifying one or more values from the identified subset of attributes, wherein the measure of the one or more respective identified values sampled in the respective failing run is greater than the average of the measures of the passing runs; and
    presenting the one or more identified values to a user.

4. The method of claim 1, further comprising:
    treating each passing run as if it were a failing run.

5. The method of claim 1, wherein an expectation value of the measure of a respective value in the failing run equals an expectation value of the measure of the respective value in the passing run when a value is generated at random.

6. The method of claim 1, further comprising creating a plurality of flattened tables based on the recorded plurality of samples for each simulation run and wherein identifying the subset of the plurality of attributes such that the distribution of values of the subset of attributes for the passing runs is different from the distribution of values of the subset of attributes for the failing runs utilizing the flattened tables.

7. The method of claim 1, further comprising receiving the plurality of identified attributes from a user.

8. The method of claim 1, wherein the design verification environment comprises a design under test and a verification environment.

9. A system for automated debugging of a design verification environment, the system comprising:
    a storage medium;
    a processor coupled with the storage medium, the processor configured for automated debugging of the design verification environment of electronic design automation by a configuration to:
        identify a plurality of attributes of the design verification environment;
        perform a plurality of simulation runs of the design verification environment;
        record a plurality of samples for each of the plurality of attributes from the plurality of simulation runs, wherein each sample includes a plurality of values of the plurality of attributes;
        determine a subset of the simulation runs that fail;
        determine a subset of simulation runs that pass;
    identify a subset of the plurality of attributes such that a distribution of values of the subset of attributes for the passing runs is different from a distribution of values of the subset of attributes for the failing runs;
    generate a log of the plurality of simulation runs;
    generate a tabular description based upon the log, wherein identifying the subset is based upon, at least in part, the tabular description; and
    utilize a plurality of flattened tables as an input to a transaction correlation algorithm to determine one or more bugs in the design verification environment;
    determine a measure for each passing run, wherein each measure for each passing run is based on a measure of the values sampled in the respective passing run;
    determine a measure for each failing run, wherein each measure for each failing run is based on a measure of the values sampled in the respective failing run; wherein the measure of the respective value sampled in the passing run is proportional to $(A+C/D)/(B+1)-(C-C/D)/(D-1)$ and the measure of the respective value sampled in the failing runs is proportional to $(A+1)/(B+1)-(C-1)/(D-1)$, wherein:

A=the number of failing runs with the respective value;
B=the number of failing runs;
C=the number of passing runs with the respective value; and
D=the number of passing runs.

10. The system for automated debugging of a design verification environment of claim 9, wherein identifying the subset of the plurality of attributes further comprises a configuration to:
   determine an average of the measures of the passing runs;
   determine an average of the measures of the failing runs; and
   utilize a difference between the average of the measures of the failing runs and the average of the passing runs to identify the subset of the plurality of attributes.

11. The system for automated debugging of a design verification environment of claim 10, wherein the processor is further configured by a configuration to:
   identify one or more values from the identified subset of attributes, wherein the measure of the one or more respective identified values sampled in the respective failing run is greater than the average of the measures of the passing runs; and
   present the one or more identified values to a user.

12. The system for automated debugging of a design verification environment of claim 9, wherein the processor is further configured by a configuration to:
   treat each passing run as if it were a failing run.

13. The system for automated debugging of a design verification environment of claim 9, wherein an expectation value of the measure of a respective value in the failing run equals an expectation value of the measure of the respective value in the passing run when a value is generated at random.

14. The system for automated debugging of a design verification environment of claim 9, wherein the processor is further configured by a configuration to:
   create a plurality of flattened tables based on the recorded plurality of samples for each simulation run and wherein identifying the subset of the plurality of attributes such that the distribution of values of the subset of attributes for the passing runs is different from the distribution of values of the subset of attributes for the failing runs utilizing the flattened tables.

15. The system for automated debugging of a design verification environment of claim 9, wherein the processor is further configured by a configuration to:
   receive the plurality of identified attributes from a user.

16. A non-transitory machine-readable storage medium containing program instructions that, when executed by a controller within a computer, cause the controller to execute a method of automated debugging of a design verification environment, the method comprising:
   identifying a plurality of attributes of the design verification environment;
   performing a plurality of simulation runs of the design verification environment;
   recording a plurality of samples for each of the plurality of attributes from the
   plurality of simulation runs, wherein each sample includes a plurality of values of the plurality of attributes;
   determining a subset of the simulation runs that fail;
   determining a subset of simulation runs that pass;
   identifying a subset of the plurality of attributes such that a distribution of values of the subset of attributes for the passing runs is different from a distribution of values of the subset of attributes for the failing runs;
   generating a log of the plurality of simulation runs;
   generating a tabular description based upon the log, wherein identifying the subset is based upon, at least in part, the tabular description; and
   utilizing a plurality of flattened tables as an input to a transaction correlation algorithm to determine one or more bugs in the design verification environment;
   determining a measure for each passing run, wherein each measure for each passing run is based on a measure of the values sampled in the respective passing run;
   determining a measure for each failing run, wherein each measure for each failing run is based on a measure of the values sampled in the respective failing run; wherein the measure of the respective value sampled in the passing run is proportional to $(A+C/D)/(B+1)-(C-C/D)/(D-1)$ and the measure of the respective value sampled in the failing runs is proportional to $(A+1)/(B+1)-(C-1)/(D-1)$, wherein:
   A=the number of failing runs with the respective value;
   B=the number of failing runs;
   C=the number of passing runs with the respective value; and
   D=the number of passing runs.

17. The machine-readable storage medium of claim 16, wherein identifying the subset of the plurality of attributes further comprises:
   determining an average of the measures of the passing runs;
   determining an average of the measures of the failing runs; and
   utilizing a difference between the average of the measures of the failing runs and the average of the passing runs to identify the subset of the plurality of attributes.

18. The machine-readable storage medium of claim 16, further comprising:
   identifying one or more values from the identified subset of attributes, wherein the measure of the one or more respective identified values sampled in the respective failing run is greater than the average of the measures of the passing runs; and
   presenting the one or more identified values to a user.

19. The machine-readable storage medium of claim 16, further comprising:
   treating each passing run as if it were a failing run.

20. The machine-readable storage medium of claim 16, wherein an expectation value of the measure of a respective value in the failing run equals an expectation value of the measure of the respective value in the passing run when a value is generated at random.

21. The machine-readable storage medium of claim 16, further comprising creating a plurality of flattened tables based on the recorded plurality of samples for each simulation run and wherein identifying the subset of the plurality of attributes such that the distribution of values of the subset of attributes for the passing runs is different from the distribution of values of the subset of attributes for the failing runs utilizing the flattened tables.

22. The machine-readable storage medium of claim 16, further comprising receiving the plurality of identified attributes from a user.

23. A method of automated debugging in a design verification environment, the method comprising:
   receiving a set of attributes of the design verification environment from a user;
   performing a plurality of simulation runs of the design verification environment;
   recording a plurality of samples for each of the plurality of user provided attributes from the plurality of simulation runs, wherein each sample includes a plurality of values of the plurality of attributes;

creating a plurality of flattened tables based on the recorded plurality of samples for each simulation run, wherein the plurality of samples are provided in a log of recorded data, the log of recorded data used to generate the plurality of flattened tables; and utilizing the plurality of flattened tables as an input to a transaction correlation algorithm to determine one or more bugs in the design verification environment;

determining a measure for each passing run, wherein each measure for each passing run is based on a measure of the values sampled in the respective passing run;

determining a measure for each failing run, wherein each measure for each failing run is based on a measure of the values sampled in the respective failing run; wherein the measure of the respective value sampled in the passing run is proportional to $(A+C/D)/(B+1)-(C-C/D)/(D-1)$ and the measure of the respective value sampled in the failing runs is proportional to $(A+1)/(B+1)-(C-1)/(D-1)$, wherein:

A=the number of failing runs with the respective value;
B=the number of failing runs;
C=the number of passing runs with the respective value; and
D=the number of passing runs.

24. The method of claim 23, wherein the sets of attributes are related.

25. The method of claim 24, wherein the sets of attributes are associated with a packet or a transaction.

26. The method of claim 24, wherein the sets of attributes comprise at least a part of a coverage definition.

27. The method of claim 23, further comprising joining two or more of the plurality of flattened tables.

28. A non-transitory machine-readable storage medium containing program instructions that, when executed by a controller within a computer, cause the controller to execute a method of automated debugging of a design verification environment, the method comprising:

receiving a set of attributes of the design verification environment from a user;

performing a plurality of simulation runs of the design verification environment;

recording a plurality of samples for each of the plurality of user provided attributes from the plurality of simulation runs, wherein each sample includes a plurality of values of the plurality of attributes;

creating a plurality of flattened tables based on the recorded plurality of samples for each simulation run, wherein the plurality of samples are provided in a log of recorded data, the log of recorded data used to generate the plurality of flattened tables; and utilizing the plurality of flattened tables as an input to a transaction correlation algorithm to determine one or more bugs in the design verification environment;

determining a measure for each passing run, wherein each measure for each passing run is based on a measure of the values sampled in the respective passing run;

determining a measure for each failing run, wherein each measure for each failing run is based on a measure of the values sampled in the respective failing run; wherein the measure of the respective value sampled in the passing run is proportional to $(A+C/D)/(B+1)-(C-C/D)/(D-1)$ and the measure of the respective value sampled in the failing runs is proportional to $(A+1)/(B+1)-(C-1)/(D-1)$, wherein:

A=the number of failing runs with the respective value;
B=the number of failing runs;
C=the number of passing runs with the respective value; and
D=the number of passing runs.

29. The machine-readable storage medium of claim 28, wherein the sets of attributes are related.

30. The machine-readable storage medium of claim 29, wherein the sets of attributes are associated with a packet or a transaction.

31. The machine-readable storage medium of claim 29, wherein the sets of attributes comprise at least a part of a coverage definition.

32. The machine-readable storage medium of claim 28, further comprising joining two or more of the plurality of flattened tables.

* * * * *